(12) United States Patent
Taira et al.

(10) Patent No.: US 10,873,140 B1
(45) Date of Patent: Dec. 22, 2020

(54) CABLE CONNECTION STRUCTURE USED IN VEHICLE ANTENNA DEVICE

(71) Applicant: HARADA INDUSTRY CO., LTD., Tokyo (JP)

(72) Inventors: Kenji Taira, Tokyo (JP); Akitomo Takahashi, Tokyo (JP); Junichi Kawahata, Tokyo (JP)

(73) Assignee: HARADA INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 16/759,537

(22) PCT Filed: Dec. 12, 2018

(86) PCT No.: PCT/JP2018/045598
§ 371 (c)(1),
(2) Date: Apr. 27, 2020

(87) PCT Pub. No.: WO2019/124175
PCT Pub. Date: Jun. 27, 2019

(30) Foreign Application Priority Data

Dec. 22, 2017 (JP) .................................. 2017-245906

(51) Int. Cl.
*H01R 13/53* (2006.01)
*H01R 12/53* (2011.01)
(Continued)

(52) U.S. Cl.
CPC .............. *H01R 12/53* (2013.01); *H01Q 1/32* (2013.01); *H01R 9/0515* (2013.01); *H01R 12/58* (2013.01);
(Continued)

(58) Field of Classification Search
CPC ...... H01R 9/05; H01R 9/0503; H01R 9/0512; H01R 9/0515; H01R 9/0518; H01R 9/0524; H05K 2201/2036; H05K 2203/0545
See application file for complete search history.

(56) References Cited

U.S. PATENT DOCUMENTS 5,951,315 A * 9/1999 Ichimura ................ H01R 12/83
439/326
6,575,762 B2 * 6/2003 Evans ................... H01R 9/0515
439/63

(Continued)

FOREIGN PATENT DOCUMENTS

JP   S56-072477 U   6/1981
JP   S59-194276 U   12/1984

(Continued)

OTHER PUBLICATIONS

Office Action dated Feb. 22, 2019 for the corresponding Japanese Patent Application No. 2017-245906.

(Continued)

*Primary Examiner* — Harshad C Patel
(74) *Attorney, Agent, or Firm* — Pearne & Gordon LLP

(57) ABSTRACT

To provide a cable connection structure used in a vehicle antenna device, capable of being reduced in size, easy to assemble, and having required tensile strength. The cable connection structure includes a connection terminal 10, a circuit board 20, a base plate 30, a positioning abutting part 40, and a cable clamp 50. The connection terminal 10 is attached to a braided wire 3 of a coaxial cable 1. The circuit board 20 has a signal line connection hole 21 and a ground line connection hole 22. The base plate 30 has a cable insertion hole 31. The positioning abutting part 40 is used for determining the position of the circuit board 20 on the base plate 30. The cable clamp 50 grasps a protective outer cover (Continued)

4 of the coaxial cable 1, holds a core wire 2 such that the core wire 2 is exposed at a predetermined height position, and holds a connection terminal 10 such that the connection terminal 10 is exposed at a predetermined height position.

14 Claims, 4 Drawing Sheets

(51) Int. Cl.
| | |
|---|---|
| H01R 9/05 | (2006.01) |
| H01R 12/58 | (2011.01) |
| H05K 1/18 | (2006.01) |
| H01Q 1/32 | (2006.01) |
| H01R 103/00 | (2006.01) |

(52) U.S. Cl.
CPC ........... *H05K 1/18* (2013.01); *H01R 2103/00* (2013.01); *H01R 2201/02* (2013.01); *H01R 2201/26* (2013.01); *H05K 2201/10287* (2013.01); *H05K 2201/10303* (2013.01); *H05K 2201/10356* (2013.01); *H05K 2201/2036* (2013.01)

(56) References Cited

U.S. PATENT DOCUMENTS

| | | | | |
|---|---|---|---|---|
| 6,955,554 | B2 * | 10/2005 | Korsunsky | H05K 7/142 |
| | | | | 439/328 |
| 7,300,299 | B2 * | 11/2007 | Wang | H05K 7/142 |
| | | | | 439/326 |
| 7,845,983 | B2 * | 12/2010 | Kawada | H01R 13/6658 |
| | | | | 439/607.46 |
| 8,657,621 | B2 * | 2/2014 | Fujiwara | H01R 13/641 |
| | | | | 439/489 |
| 9,680,244 | B1 * | 6/2017 | Dernovsek | H01R 12/716 |
| 10,541,467 | B1 * | 1/2020 | Brigham | H01Q 21/005 |
| 2004/0152353 | A1 * | 8/2004 | Kawamae | H01R 12/721 |
| | | | | 439/328 |
| 2005/0048828 | A1 * | 3/2005 | Ho | H01R 12/52 |
| | | | | 439/326 |
| 2012/0170261 | A1 * | 7/2012 | Hu | H05K 3/366 |
| | | | | 362/217.16 |
| 2016/0365684 | A1 * | 12/2016 | Li | H01R 24/52 |
| 2017/0012396 | A1 * | 1/2017 | Kwon | H01R 27/02 |

FOREIGN PATENT DOCUMENTS

| | | |
|---|---|---|
| JP | H02-133869 U | 11/1990 |
| JP | H06-050392 U | 7/1994 |
| JP | 2001-223511 A | 8/2001 |
| JP | 2001-291565 A | 10/2001 |
| JP | 2002-329559 A | 11/2002 |
| JP | 2011-061526 A | 3/2011 |

OTHER PUBLICATIONS

Decision to Grant dated Jun. 12, 2019 for the corresponding Japanese Patent Application No. 2017-245906.

* cited by examiner

CABLE CONNECTION STRUCTURE USED IN VEHICLE ANTENNA DEVICE

TECHNICAL FIELD

The present invention relates to a cable connection structure used in a vehicle antenna device, and more particularly to a cable connection structure suitable for an antenna having a low-height structure or compact structure, such as a low-profile antenna device.

BACKGROUND ART

A vehicle antenna device is installed on a vehicle roof or the like. A signal cable connected to a tuner or the like provided in a vehicle is connected to a circuit board of the vehicle antenna device through an installation hole formed in the vehicle roof. The signal cable is connected to the antenna device using a cable attachment structure disclosed in, e.g., Patent Document 1. In the cable connection structure disclosed in Patent Document 1, a metal clamp fixed with a signal cable by clamping in advance is inserted through a through hole formed in a base plate to be pulled above the base plate, turned by a predetermined angle, and then pulled downward to be fixed to a groove formed in the base plate. Then, the signal cable fixed to the metal clamp is soldered to the circuit board.

CITATION LIST

Patent Document

Patent Document 1: Japanese Patent Application Kokai Publication No. 2002-329559

DISCLOSURE OF THE INVENTION

Problems to be Solved by the Invention

However, in the cable connection structure like the one disclosed in Patent Document 1, it is necessary to fix the metal clamp to the signal cable by clamping in advance and to provide a through hole for insertion of the metal clamp. Therefore, it is necessary to provide the through hole for inserting the metal clamp larger than that for insertion of the signal cable, and this hinders miniaturization. Further, since both the metal clamp and the base plate are made of metal, when the press-fitting dimension for press-fitting the metal clamp in the groove of the base plate deviates, even if only slightly, from a designed value, a problem arises with assembly. Further, when backlash occurs due to allowance, it is difficult to achieve position alignment between the metal clamp and the through hole formed in the circuit board, whereby easily assembly is difficult. Furthermore, in this structure, since the metal clamp is fixed in the groove formed in the base plate by pulling the signal cable downward, when upward pushing force occurs in the signal cable, the metal clamp moves, whereby the problem such as the breaking of the signal wire occurs. Thus, a cable connection structure has been desired capable of being reduced in size, easy to assemble and having required tensile strength.

In view of the above situation, the present invention has been made and the object thereof is to provide a cable connection structure used in a vehicle antenna device, capable of being reduced in size, easy to assemble and having required tensile strength.

Means for Solving the Problems

In order to achieve the above object of the present invention, a cable connection structure according to the present invention used in a vehicle antenna device may comprise: a connection terminal attached to a braided wire of a coaxial cable having a core wire as a signal line, the braded wire as a ground line, and a protective outer cover constituting an outermost sheath; a circuit board having a signal line connection hole for the core wire of the coaxial cable and a ground line connection hole for the connection terminal; a base plate on which the circuit board is placed, having a cable insertion hole through which the coaxial cable is inserted; a positioning abutting part for determining the position of the circuit board on the base plate; and a cable clamp grasping the protective outer cover of the coaxial cable, holding the core wire so as to be exposed at a predetermined height position toward the circuit board side for being electrically connected to the signal line connection hole of the circuit board, and holding the connection terminal so as to be exposed at a predetermined height position toward the circuit board side for being electrically connected to the ground line connection hole of the circuit board.

The cable clamp may be disposed between the circuit board and the base plate and be fitted into the cable insertion hole of the base plate from a side on which the circuit board is placed.

The positioning abutting part may be disposed on the base plate.

The connection terminal may function also as the positioning abutting part by being held through the cable clamp.

The connection terminal may have a blade-shaped part vertically extending with respect to a surface direction of the circuit board, and the ground line connection hole of the circuit board may be formed into a slit shape so as to correspond to the blade-shaped part of the connection terminal.

The ground line connection hole of the circuit board may be formed into a slit-like hole elongated parallel to a direction away from the positioning abutting part.

A tip of the blade-shaped part of the connection terminal ma be chamfered.

The connection terminal may be crimped to the braided wire of the coaxial cable.

When the circuit board is disposed to be parallel to the base plate from a state where the circuit board is inclined with one end thereof abutting on the positioning abutting part and with the other end thereof lifted upward during assembling, the cable clamp may hold the core wire and the connection terminal so as to have a height relationship that the connection terminal is inserted into the ground line connection hole before the core wire of the coaxial cable is inserted into the signal line connection hole.

The cable clamp may hold the connection terminal at a side close to the positioning abutting part and the core wire at a side far from the positioning abutting part.

The circuit board may have the ground line connection hole at a side close to the positioning abutting part and the signal line connection hole at a side far from the positioning abutting part.

The cable clamp may have a cable come-off preventing projection that projects toward an outer peripheral surface of the protective outer cover of the coaxial cable so as to prevent the coaxial cable from coming off from the cable clamp.

The cable clamp may have a cable clamp come-off preventing projection that projects toward an inner peripheral surface of the cable insertion hole so as to prevent the cable clamp from coming off from the cable insertion hole of the base plate.

The cable clamp may be formed asymmetric so as to fix a shaft rotation direction thereof fitted into the cable insertion hole to be predetermined direction.

Advantageous Effects of the Invention

The cable connection structure according to the present invention used in a vehicle antenna device has advantages in that it is capable of being reduced in size, easy to assemble and has required tensile strength.

BEST MODE FOR CARRYING OUT THE INVENTION

Figure 1:
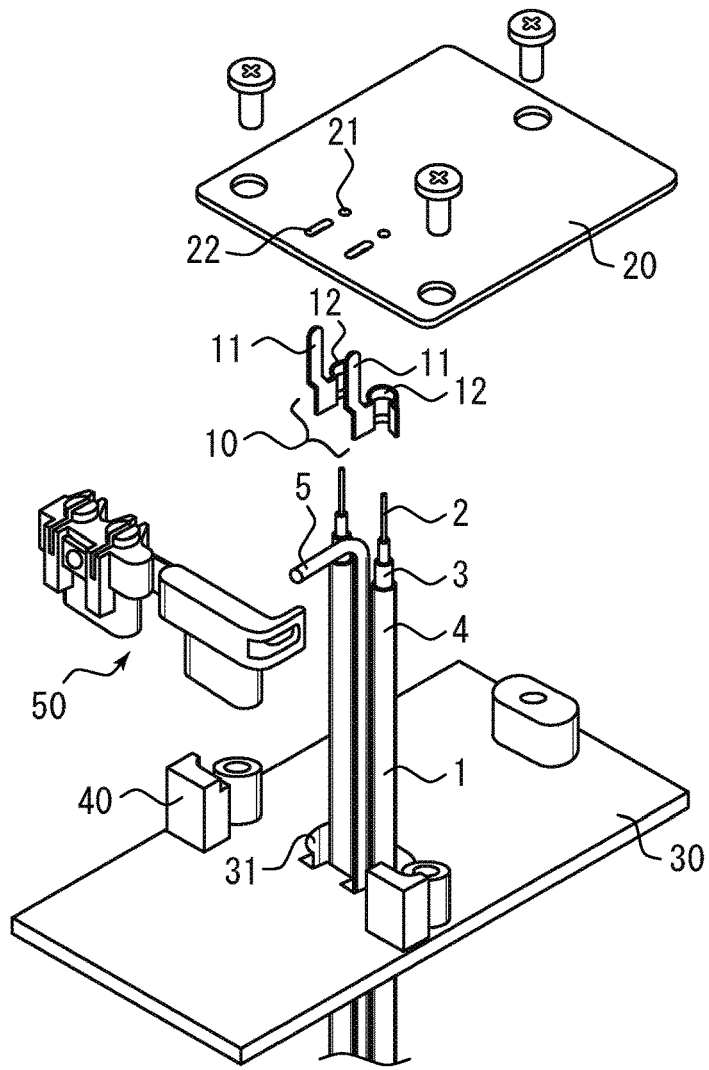
FIG. 1 is a schematic exploded perspective view for explaining a cable connection structure according to the present invention used in a vehicle antenna device.
Figure 2:
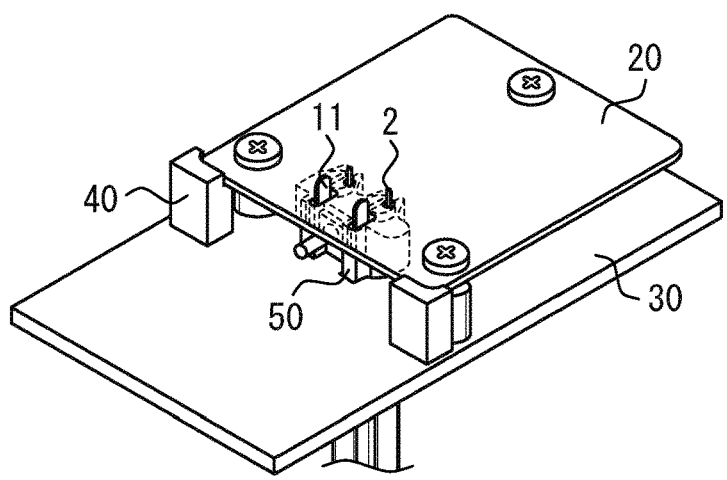
FIG. 2 is a schematic perspective view for explaining an assembled state of the cable connection structure according to the present invention used in a vehicle antenna device.
Figure 3:
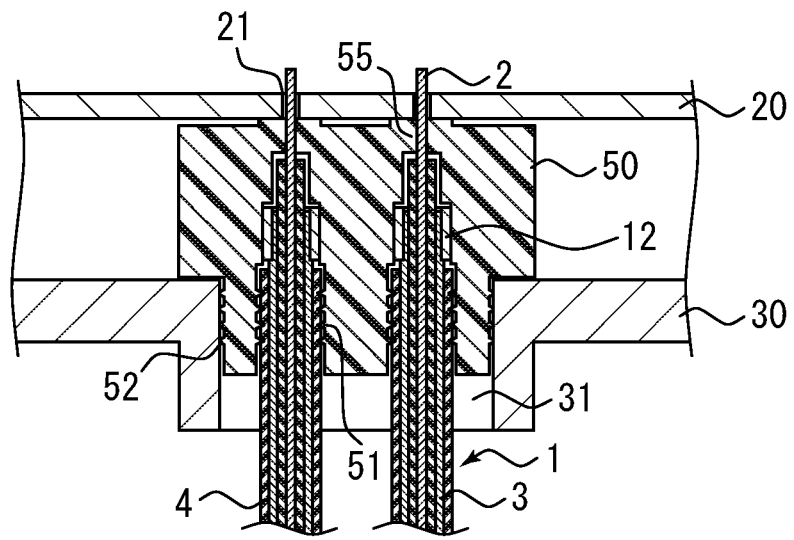
FIG. 3 is a schematic cross-sectional view, as viewed from the front, for explaining the assembled state of the cable connection structure according to the present invention used in a vehicle antenna device.

Hereinafter, an embodiment for practicing the present invention will be described with reference to the accompanying drawings. FIG. 1 is a schematic exploded perspective view for explaining a cable connection structure according to the present invention used in a vehicle antenna device. FIG. 2 is a schematic perspective view for explaining an assembled state of the cable connection structure according to the present invention used in a vehicle antenna device. FIG. 3 is a schematic cross-sectional view, as viewed from the front, for explaining the assembled state of the cable connection structure according to the present invention used in a vehicle antenna device. In the drawings, the same reference numerals denote the same parts. As illustrated, the cable connection structure according to the present invention used in a vehicle antenna device mainly includes a connection terminal 10, a circuit board 20, a base plate 30, a positioning abutting part 40, and a cable clamp 50. The cable connection structure according to the present invention is used for connecting a vehicle antenna device placed on a vehicle roof and a coaxial cable.

The connection terminal 10 is provided to a coaxial cable 1. The coaxial cable 1 includes a core wire 2 which is a signal line, a braided wire 3 which is a ground line, and a protective outer cover 4 constituting the outermost sheath thereof. The coaxial cable 1 may be a typical one. In the illustrated example, two coaxial cables 1 are used and one power cable 5 is used. However, the number of the coaxial cables 1 is not limited to this, and only one coaxial cable or more cables may be used in the present invention.

The connection terminal 10 is attached to the braided wire 3 of the coaxial cable 1. To the braided wire 3, the connection terminal 10 may be attached by crimping. Also, this may be attached by soldering. In either case, the connection terminal 10 and the braided wire 3 are electrically connected to each other. Further, in the illustrated example, the connection terminal 10 is attached to the braided wire 3 after the coaxial cable 1 is inserted through a cable insertion hole 31 formed in the base plate 30 to be described later. Thus, there is no problem if the connection terminal 10 has a diameter larger than the diameter of the cable insertion hole 31. Further, in the example, the connection terminal 10 has a blade-shaped part 11 vertically extending with respect to the surface direction of the circuit board 20. More specifically, the connection terminal 10 includes a crimping part 12 attached to the braided wire 3 and a blade-shaped part 11 formed using the same material as the crimping part 12. The blade-shaped part 11 extends vertically with respect to the surface direction of the circuit board 20. In the illustrated example, two connection terminals 10 are provided so as to correspond to the number of the coaxial cables 1. The connection terminal 10 is attached to the braided wire 3 of the coaxial cable 1 and thus serves as a ground. Therefore, even when a plurality of coaxial cables 1 are used as in the illustrated example, the blade-shaped part 11 and the crimping part 12 of each of the connection terminals 10 can be formed integrally using the same material.

The circuit board 20 has circuit elements required for a vehicle antenna device, an amplifier circuit and the like placed thereon. In the cable connection structure according to the present invention used in a vehicle antenna device, the circuit board 20 includes a signal line connection hole 21 and a ground line connection hole 22. The core wire 2 of the coaxial cable 1 is inserted into the signal line connection hole 21 and electrically connected thereto by soldering or the like. The connection terminal 10 attached to the braided wire 3 of the coaxial cable 1 is inserted into the ground line connection hole 22 and electrically connected thereto by soldering or the like. Since the connection terminal 10 has the blade shaped part 11, the illustrated ground line connection hole 22 is formed into a slit shaped hole corresponding thereto.

The base plate 30 has the circuit board 20 placed thereon. The cable insertion hole 31 thorough which the coaxial cable 1 is to be inserted is provided in the base plate 30. The cable insertion hole 31 may be of any size as long as the coaxial cable 1 or a power cable 5 can pass therethrough. The base plate 30 is fixed to, for example, a vehicle roof. Specifically, the base plate 30 may be a so-called resin base formed of an insulating material such as resin or a so-called metal base formed of a conducting material such as metal. Alternatively, the base plate 30 may be a composite base of resin and metal. For example, a threaded boss is provided on the back surface side of the base plate 30, is inserted into a hole formed in the vehicle roof, and is fixed to the vehicle roof by using a nut from the vehicle interior side so as to interpose the roof. The cable insertion hole 31 may be provided at a position corresponding to the threaded boss. Further, the base plate 30 may be constituted to be covered with an antenna cover having an interior space in which, for example, an antenna element, a circuit board and the like are accommodated.

The positioning abutting part 40 is provided for determining the position of the circuit board 20 on the base plate 30. When the circuit board 20 is assembled onto the base plate 30, the circuit board 20 is disposed to be parallel to the base plate 30 from a state where the circuit board 20 is inclined with one end thereof abutting on the positioning abutting part 40 and with the other end thereof lifted upward. By this assembly, the circuit board 20 is accurately disposed at a predetermined position on the base plate 30. In the illustrated example, the positioning abutting part 40 is constituted by two block-shaped bodies which are disposed on the base plate 30 so as to abut against the corners of the circuit board 20. However, the present invention is not limited to this, and the positioning abutting part 40 may have any shape as long as the relative positions of the circuit board 20 and the base plate 30 can be accurately determined. For example, a recessed part may be formed in the circuit board 20 and a protruding part fitted into the recessed part may be formed on the base plate 30. Further, a protruding part abutting against the entire length of one side of the circuit board 20 may be formed on the base plate 30.

The cable clamp 50 holds the connection terminal 10. Specifically, for example, a groove is provided into which the connection terminal 10 crimped to the braided wire 3 of the coaxial cable 1 is fitted. The cable clamp 50 may have any holding structure as long as the connection terminal 10 is pinched and fixed therein. Further, the cable clamp 50 grasps the protective outer cover 4 of the coaxial cable 1. That is, the cable clamp 50 grasps the protective outer cover 4 in such a way as to pinch the coaxial cable 1. Further, the cable clamp 50 holds the core wire 2 such that the core wire 2 is exposed to the circuit board 20 side at a predetermined height position. Since the cable clamp 50 is configured to hold the connection terminal 10 and the core wire 2, it should be made of an insulating material so as to prevent electrical connection therebetween.

As illustrated in FIG. 3, a core wire holding part 55 is provided, that holds the core wire 2 at a part of the cable clamp 50 near the circuit board 20. By doing so, the core wire 2 is fixed, whereby the core wire 2 can electrically be connected to the signal line connection hole 21 of the circuit board 20. In the illustrated example, the cable clamp 50 is illustrated as having such a structure as to pinch the connection terminal 10 from both sides after the coaxial cable 1 is attached thereto. This allows the assembly to be facilitated. The cable clamp 50 holds the connection terminal 10 such that the connection terminal 10 is exposed to the circuit board 20 side at a predetermined height position. This allows the connection terminal 10 to be electrically connected to the ground line connection hole 22 of the circuit board 20. Further, a cable come-off preventing projection 51 may be provided to the cable clamp 50, that projects toward an outer peripheral surface of the protective outer cover of the coaxial cable 1 so as to prevent the coaxial cable 1 from coming off from the cable clamp 50.

As illustrated in FIGS. 2 and 3, the cable clamp 50 is disposed between the circuit board 20 and the base plate 30. That is, the cable clamp 50 has a height dimension corresponding to the distance between the circuit board 20 and the base plate 30 so that it is sandwiched therebetween. Further, the cable clamp 50 is configured to be fitted to the cable insertion hole 31 of the base plate 30 from a side on which the circuit board 20 is placed. That is, the cable insertion hole 31 of the base plate 30 has a recessed part so as to allow the cable clamp 50 to be fitted therearound. Specifically, the cable insertion hole 31 may be configured to have a diameter larger than the diameter of the coaxial cable 1 at the side thereof on which the circuit board 20 is placed and to be fitted with the cable clamp 50 while holding the coaxial cable 1. Since the cable clamp 50 is fitted into the cable insertion hole 31 while grasping the protective outer cover 4 of the coaxial cable 1, the coaxial cable 1 can be gripped more firmly. As a result, sufficient tensile strength can be achieved.

Further, the cable clamp 50 may be formed asymmetric so as to fix a shaft rotation direction thereof fitted into the cable insertion hole 31 of the base plate 30 to be a predetermined direction. For example, as illustrated, a configuration may be possible in which a projecting part is formed to project from the side surface of the cable clamp 50, and a recessed part to be fitted to the projecting part is formed in the side surface of the cable insertion hole 31. With this configuration, the positional relationship between the core wire 2 and the connection terminal 10 can be fixed, whereby preventing error in the fitting direction of the cable clamp 50. Additionally, for example, when a plurality of coaxial cables 1 are to be used, the coaxial cables can be oriented correctly.

Further, as illustrated in FIG. 3, a cable clamp come-off preventing projection 52 may be provided to the cable clamp 50, that projects toward an inner peripheral surface of the cable insertion hole 31 so as to prevent the cable clamp 50 from coming off from the cable insertion hole 31 of the base plate 30. With this configuration, even when an upward pushing force acts on the coaxial cable 1, a load applied onto the circuit board 20 side can be further reduced.

In the illustrated example, the cable clamp 50 is disposed between the circuit board 20 and the base plate 30 and is fitted into the cable insertion hole 31 from a side on which the circuit board 20 is placed. With this configuration, since the position of the cable clamp 50 firmly grasping the coaxial cable is fixed, even if the coaxial cable is pushed upward, disconnection will not occur. The present invention is not limited to the above example in which the cable clamp is disposed between the circuit board and the base plate, and the cable clamp 50 grasping the coaxial cable in a pinching manner may be fitted into the cable insertion hole 31 of the base plate 30 from a side opposite to the side at which the circuit board is placed. In this case, in order to prevent come-off of the cable clamp when a pulling-down force acts on the coaxial cable, an engagement part or the like may be appropriately provided so as to fix the cable clamp in the cable insertion hole of the base plate.

In the cable connection structure according to the present invention used in a vehicle antenna device, since the cable clamp 50 is disposed between the circuit board 20 and the base plate 30, a cable can be connected directly from just below the circuit board 20 in the shortest route. Therefore, a space on the base plate 30 can be efficiently used, which in turn allows miniaturization of a vehicle antenna device. Also, since the positional relationship between the core wire 2 and the connection terminal 10 is fixed, the core wire 2 can easily be connected to the connection hole of the circuit board 20.

Figure 4:
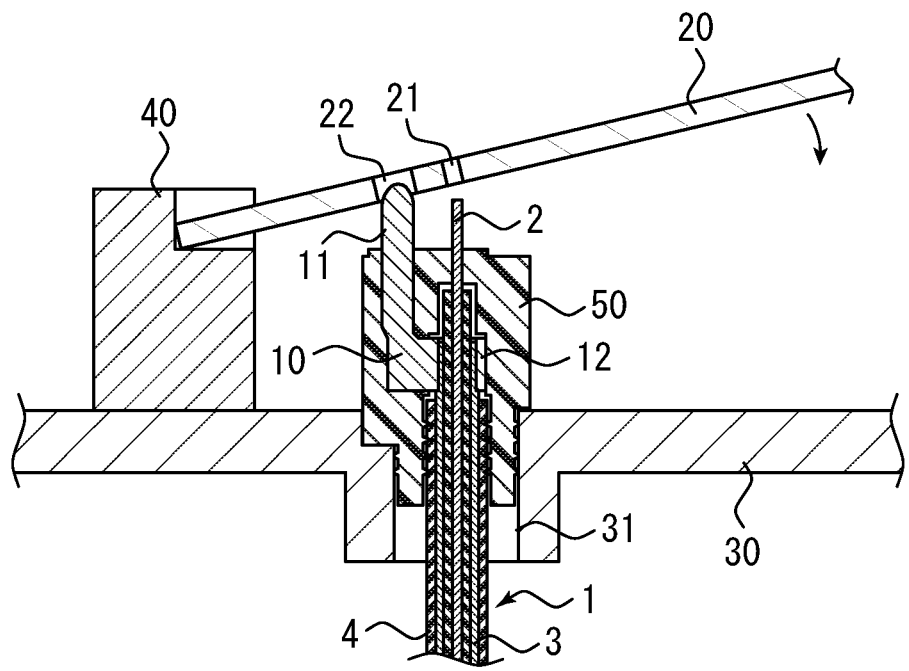
FIG. 4 is a schematic cross-sectional view, as viewed from the side, for explaining a state where the cable connection structure according to the present invention used in a vehicle antenna device is being assembled.

Next, the detailed assembly is described using FIG. 4. FIG. 4 is a schematic cross-sectional view, as viewed from the side, for explaining a state where the cable connection structure according to the present invention used in a vehicle antenna device is being assembled. In FIG. 4, the same reference numerals as those in FIGS. 1 to 3 denote the same parts as those in FIGS. 1 to 3. As illustrated, the connection terminal 10 is crimped to the braided wire 3 of the coaxial cable 1 first, attached with the cable clamp 50, and then is fitted into the cable insertion hole 31 of the base plate 30. After that, the circuit board 20 is assembled from its inclined state with one end thereof abutting against the positioning abutting part 40 and with the other end thereof lifted upward, and then the circuit board 20 is disposed so as to be parallel to the base plate 30. The cable clamp 50 is configured to hold the core wire 2 and the connection terminal 10 in such a height relationship that the connection terminal 10 is inserted into the ground line connection hole 22 before the core wire 2 of the coaxial cable 1 is inserted into the signal line connection hole 21. For example, the cable clamp 50 may hold the connection terminal 10 at a side close to the positioning abutting part 40 and the core wire 2 at a side far from the positioning abutting part 40. Correspondingly, the circuit board 20 may have the ground line connection hole 22 at a side close to the positioning abutting part 40 and the signal line connection hole 21 at a side far from the positioning abutting part 40. As a result, the connection terminal 10 is inserted into the ground line connection hole 22 first, and then the core wire 2 is inserted into the signal line connection hole 21. Thus, it is possible to reduce a risk that the core wire 2 is bent by the circuit board 20 at the time of assembly.

As described above, the cable connection structure according to the present invention used in a vehicle antenna device is easy to assemble, making it possible to reduce assembly failures.

As illustrated in FIGS. 1, 2, and the like, the ground line connection hole 22 of the circuit board 20 may be formed into a slit-like hole elongated parallel to a direction away from the positioning abutting part 40. Thus, when the circuit board 20 is assembled to be parallel to the base plate 30 from a state where the circuit board 20 is inclined with one end thereof abutting on the positioning abutting part 40 and with the other end thereof lifted upward, the blade-shaped part 11 of the connection terminal 10 is easily inserted into the slit-like ground line connection hole 22 from the corner thereof. In this case, when the tip of the blade-shaped part 11 is chamfered, the blade-shaped part 11 is inserted into the ground line connection hole 22 more smoothly as illustrated in FIG. 4. Although the opposite corners are chamfered in the illustrated example, the present invention is not limited to this, and a corner of only one side, e.g., only the corner on the positioning abutting part 40 side may be chamfered.

Figure 5:
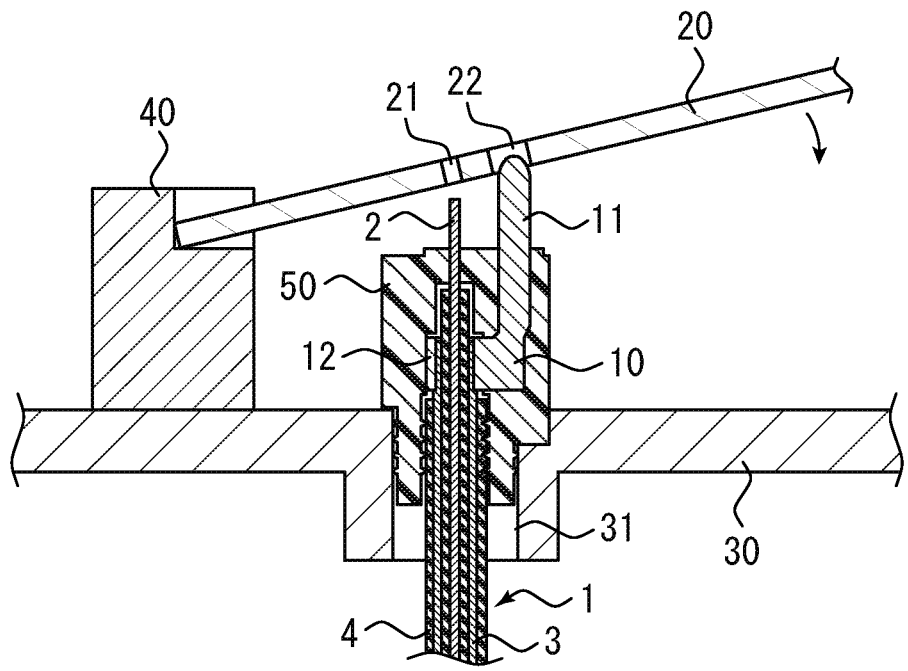
FIG. 5 is a schematic cross-sectional view, as viewed from the side, for explaining another example of the state where the cable connection structure according to the present invention used in a vehicle antenna device is being assembled.

Next, another example of the cable connection structure according to the present invention used in a vehicle antenna device is described. FIG. 5 is a schematic cross-sectional view, as viewed from the side, for explaining another example of the state where the cable connection structure according to the present invention used in a vehicle antenna device is being assembled. In FIG. 5, the same reference numerals as those in FIGS. 1 to 4 denote the same parts as those in FIGS. 1 to 4. As illustrated, the cable clamp 50 may hold the core wire 2 at a side close to the positioning abutting part 40 and the connection terminal 10 at a side far from the positioning abutting part 40. In this case, the top end of the blade-shaped part 11 of the connection terminal 10 may be set higher in height position than the top end of the core wire 2. Even in such a configuration, the connection terminal 10 is inserted into the ground line connection hole 22 first, and then the core wire 2 is inserted into the signal line connection hole 21.

Figure 6:
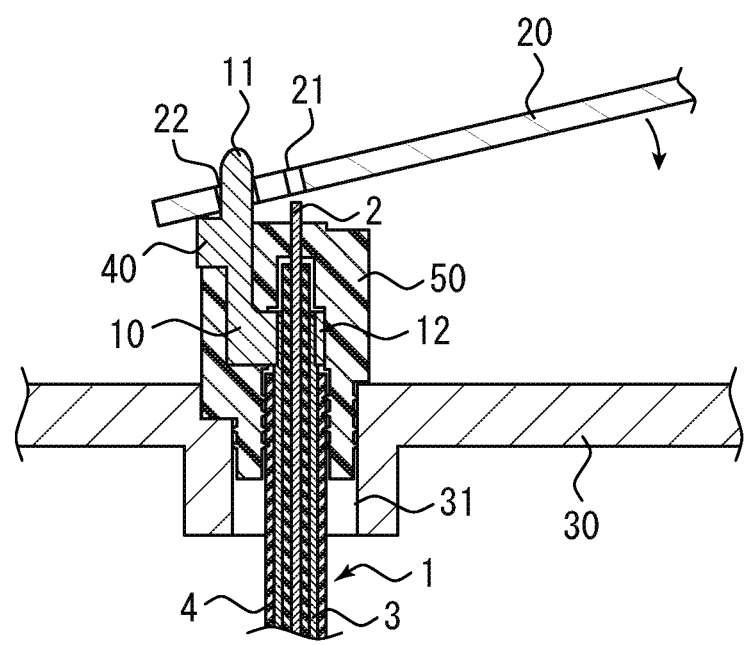
FIG. 6 is a schematic cross-sectional view, as viewed from the side, for explaining a still another example of the state where the cable connection structure according to the present invention used in a vehicle antenna device is being assembled.

Further, FIG. 6 is a schematic cross-sectional view, as viewed from the side, for explaining a still another example of the state where the cable connection structure according to the present invention used in a vehicle antenna device is being assembled. In FIG. 6, the same reference numerals as those in FIGS. 1 to 5 denote the same parts as those in FIGS. 1 to 5. In this illustrated example, the connection terminal 10 is configured to function also as the positioning abutting part 40. As illustrated, the top end of the blade-shaped part 11 of the connection terminal 10 is set higher in height position than the top end of the core wire 2. A projection is formed to project from the lower portion of the blade-shaped part 11 so as to serve as the positioning abutting part 40. In this configuration, the blade-shaped part 11 is hooked into the ground line connection hole 22 of the circuit board 20 to position the circuit board 20. At this time, the positioning abutting part 40 functions to prevent the circuit board 20 from going too deep to contact the core wire 2 before the circuit board 20 gets in position. Thereafter, the circuit board 20 is assembled so as to be parallel to the base plate 30.

Figure 7:
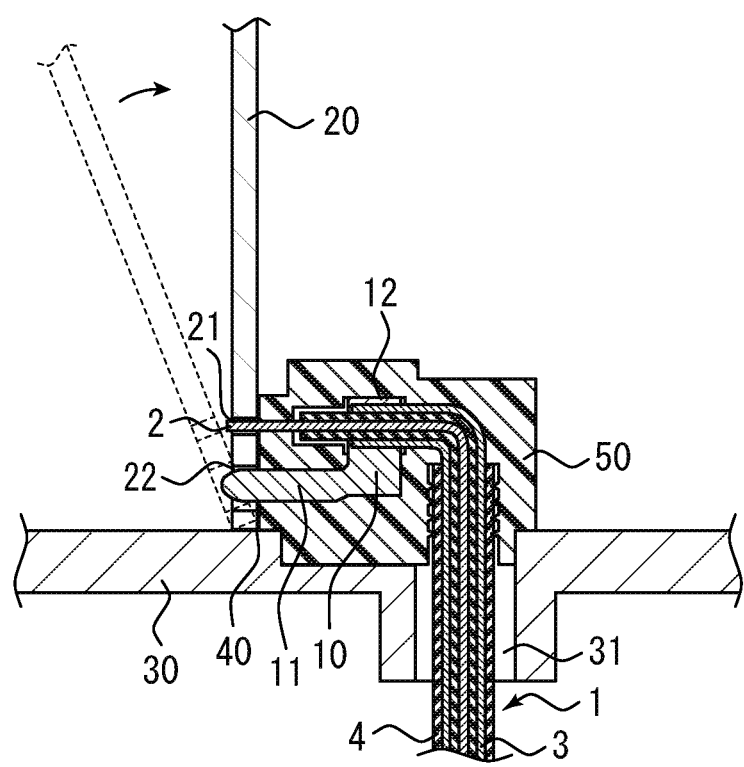
FIG. 7 is a schematic cross-sectional view, as viewed from the front, for explaining an example in which the cable connection structure according to the present invention used in a vehicle antenna device is applied to a vertical board.

In the above illustrated examples, the circuit board and the base plate are disposed parallel to each other; however, the present invention is not limited to this. FIG. 7 is a schematic cross-sectional view, as viewed from the front, for explaining an example in which the cable connection structure according to the present invention used in a vehicle antenna device is applied to a vertical board. In FIG. 7, the same reference numerals as those in FIGS. 1 to 6 denote the same parts as those in FIGS. 1 to 6. As illustrated, in this example, the circuit board 20 is disposed vertical to the base plate 30. In this case, the coaxial cable 1 may be bent by 90 degrees in the cable clamp 50. Further, in the illustrated example, the corner at which the base plate 30 and the cable clamp 50 are fitted to each other functions as the positioning abutting part 40 and, in this case, as denoted by dashed line in FIG. 7, first the front end of the circuit board 20 is inserted obliquely into the corner, and then the circuit board 20 is arranged so as to take a upright posture with respect to the base plate 30.

The cable connection structure according to the present invention used in a vehicle antenna device is not limited to the above illustrative examples but may be variously modified without departing from the scope of the present invention.

REFERENCE SINGS LIST

1: Coaxial cable
2: Core wire
3: Braided wire
4: Protective outer cover
5: Power cable
10: Connection terminal
11: Blade-shaped part
12: Crimping part
20: Circuit board
21: Signal line connection hole
22: Ground line connection hole
30: Base plate
31: Cable insertion hole
40: Positioning abutting part
50: Cable clamp
51: Cable come-off preventing projection
52: Cable clamp come-off preventing projection
55: Core wire holding part

What is claimed is:
1. A cable connection structure used in a vehicle antenna device, the cable connection structure comprising:

a connection terminal attached to a braided wire of a coaxial cable having a core wire as a signal line, the braded wire as a ground line, and a protective outer cover constituting an outermost sheath;

a circuit board having a signal line connection hole for the core wire of the coaxial cable and a ground line connection hole for the connection terminal;

a base plate on which the circuit board is placed, having a cable insertion hole through which the coaxial cable is inserted;

a positioning abutting part for determining the position of the circuit board on the base plate; and a cable clamp grasping the protective outer cover of the coaxial cable, holding the core wire so as to be exposed at a predetermined height position toward the circuit board side for being electrically connected to the signal line connection hole of the circuit board, and holding the connection terminal so as to be exposed at a predetermined height position toward the circuit board side for being electrically connected to the ground line connection hole of the circuit board.

2. The cable connection structure according to claim 1, wherein the cable clamp is disposed between the circuit board and the base plate and is fitted into the cable insertion hole of the base plate from a side on which the circuit board is placed.

3. The cable connection structure according to claim 1, wherein the positioning abutting part is disposed on the base plate.

4. The cable connection structure according to claim 1, wherein the connection terminal functions also as the positioning abutting part by being held through the cable clamp.

5. The cable connection structure according to claim 1, wherein the connection terminal has a blade-shaped part vertically extending with respect to a surface direction of the circuit board, and the ground line connection hole of the circuit board is formed into a slit shape so as to correspond to the blade-shaped part of the connection terminal.

6. The cable connection structure according to claim 5, wherein the ground line connection hole of the circuit board is formed into a slit-like hole elongated parallel to a direction away from the positioning abutting part.

7. The cable connection structure according to claim 5, wherein a tip of the blade-shaped part of the connection terminal is chamfered.

8. The cable connection structure according to claim 1, wherein the connection terminal is crimped to the braided wire of the coaxial cable.

9. The cable connection structure according to claim 1, wherein, when the circuit board is disposed to be parallel to the base plate from a state where the circuit board is inclined with one end thereof abutting on the positioning abutting part and with the other end thereof lifted upward during assembling, the cable clamp holds the core wire and the connection terminal so as to have a height relationship that the connection terminal is inserted into the ground line connection hole before the core wire of the coaxial cable is inserted into the signal line connection hole.

10. The cable connection structure according to claim 1, wherein the cable clamp holds the connection terminal at a side close to the positioning abutting part and the core wire at a side far from the positioning abutting part.

11. The cable connection structure according to claim 1, wherein the circuit board has the ground line connection hole at a side close to the positioning abutting part and the signal line connection hole at a side far from the positioning abutting part.

12. The cable connection structure according to claim 1, wherein the cable clamp has a cable come-off preventing projection that projects toward an outer peripheral surface of the protective outer cover of the coaxial cable so as to prevent the coaxial cable from coming off from the cable clamp.

13. The cable connection structure according to claim 1, wherein the cable clamp has a cable clamp come-off preventing projection that projects toward an inner peripheral surface of the cable insertion hole so as to prevent the cable clamp from coming off from the cable insertion hole of the base plate.

14. The cable connection structure according to claim 1, wherein the cable clamp is formed asymmetric so as to fix a shaft rotation direction thereof fitted into the cable insertion hole to be a predetermined direction.

* * * * *

UNITED STATES PATENT AND TRADEMARK OFFICE
CERTIFICATE OF CORRECTION

PATENT NO. : 10,873,140 B1
APPLICATION NO. : 16/759537
DATED : December 22, 2020
INVENTOR(S) : Kenji Taira et al.

Page 1 of 1

It is certified that error appears in the above-identified patent and that said Letters Patent is hereby corrected as shown below:

In the Specification

Column 3, Line 6, "hole to be predetermined" should read -- hole to be a predetermined --

Signed and Sealed this
Twenty-seventh Day of July, 2021

Drew Hirshfeld
*Performing the Functions and Duties of the*
*Under Secretary of Commerce for Intellectual Property and*
*Director of the United States Patent and Trademark Office*